(12) United States Patent
Coccio

(10) Patent No.: US 9,146,283 B2
(45) Date of Patent: Sep. 29, 2015

(54) BATTERY TESTER

(75) Inventor: Damian Coccio, Norristown, PA (US)

(73) Assignee: NuWave Technologies, Inc., Norristown, PA (US)

( * ) Notice: Subject to any disclaimer, the term of this patent is extended or adjusted under 35 U.S.C. 154(b) by 786 days.

(21) Appl. No.: 13/459,320

(22) Filed: Apr. 30, 2012

(65) Prior Publication Data

US 2012/0212233 A1      Aug. 23, 2012

Related U.S. Application Data

(62) Division of application No. 12/125,575, filed on May 22, 2008, now Pat. No. 8,193,771.

(51) Int. Cl.
| | | |
|---|---|---|
| *H02J 7/00* | (2006.01) | |
| *H02J 7/16* | (2006.01) | |
| *G08B 21/00* | (2006.01) | |
| *G01N 27/416* | (2006.01) | |
| *G10D 9/00* | (2006.01) | |
| *G01R 31/36* | (2006.01) | |
| *G10H 1/32* | (2006.01) | |
| *G10H 3/18* | (2006.01) | |
| *H02J 7/04* | (2006.01) | |
| *H02J 7/02* | (2006.01) | |

(52) U.S. Cl.
CPC .............. *G01R 31/3634* (2013.01); *G10H 1/32* (2013.01); *G10H 3/186* (2013.01); *G01R 31/3682* (2013.01); *G01R 31/3696* (2013.01); *G10H 2230/035* (2013.01); *H02J 7/0003* (2013.01); *H02J 7/0027* (2013.01); *H02J 7/025* (2013.01); *H02J 7/042* (2013.01)

(58) Field of Classification Search
USPC .............. 702/127; 701/33; 84/453, 600, 723; 324/425, 437, 426, 427, 435, 433; 439/668, 669; 340/636.1, 636.11, 340/636.12, 636.15; 320/132, 111, 134, 320/DIG. 21
See application file for complete search history.

(56) References Cited

U.S. PATENT DOCUMENTS

| | | |
|---|---|---|
| 1,337,160 A | 4/1920 | Riebeth |
| 3,493,863 A | 2/1970 | Girdwood |
| 3,974,441 A | 8/1976 | Van Den Haak |
| 4,020,243 A | 4/1977 | Oldford |
| 4,360,780 A | 11/1982 | Skutch, Jr. |
| 4,439,736 A | 3/1984 | Schwartz |
| 4,514,695 A | 4/1985 | Lau |
| 4,533,864 A | 8/1985 | Austin |
| 4,575,680 A | 3/1986 | Gold |
| 4,743,831 A | 5/1988 | Young |
| 4,800,336 A * | 1/1989 | Mikami et al. ................ 324/426 |

(Continued)

*Primary Examiner* — Edward Tso
*Assistant Examiner* — Alexis A Boateng
(74) *Attorney, Agent, or Firm* — Howson & Howson LLP

(57) ABSTRACT

A battery tester determines a remaining level of charge of a battery mounted within a separate electronic device having an audio jack. The battery tester includes a plug and a circuit having a high impedance input amplifier. At least one electrical contact of the plug is electrically coupled to an input of the high impedance input amplifier. The plug is removably insertable within the audio jack such that the battery of the separate electronic device is electrically connected to the input of the high impedance input amplifier. When electrically coupled to the battery, an output of the high impedance input amplifier provides a signal proportional to the remaining level of charge of the battery, whereby the remaining level of charge of the battery is obtainable by the battery tester without having to remove the battery from the electronic device.

10 Claims, 5 Drawing Sheets

(56) References Cited

U.S. PATENT DOCUMENTS

| | | | |
|---|---|---|---|
| 5,003,250 A | 3/1991 | Hukuba | |
| D330,519 S | 10/1992 | Wang | |
| 5,157,708 A * | 10/1992 | Garthwaite et al. | 379/21 |
| 5,216,371 A | 6/1993 | Nagai | |
| 5,345,163 A | 9/1994 | Gibbons et al. | |
| 5,376,887 A | 12/1994 | Saubolle | |
| 6,121,753 A | 9/2000 | Walker et al. | |
| 6,140,928 A * | 10/2000 | Shibuya et al. | 340/636.13 |
| 6,347,958 B1 | 2/2002 | Tsai | |
| 6,433,512 B1 | 8/2002 | Birkler et al. | |
| 6,653,543 B2 | 11/2003 | Kulas | |
| 7,351,905 B2 | 4/2008 | Ioffe | |
| 7,439,706 B2 | 10/2008 | Brenner | |
| 2003/0001578 A1 | 1/2003 | Lam | |
| 2005/0017726 A1 | 1/2005 | Koran et al. | |
| 2008/0265836 A1 * | 10/2008 | Inoue et al. | 320/110 |
| 2009/0096399 A1 | 4/2009 | Chen et al. | |
| 2009/0251149 A1 * | 10/2009 | Buckner et al. | 324/426 |
| 2009/0292416 A1 * | 11/2009 | Ubik et al. | 701/33 |
| 2010/0090702 A1 * | 4/2010 | McMillen et al. | 324/426 |

* cited by examiner

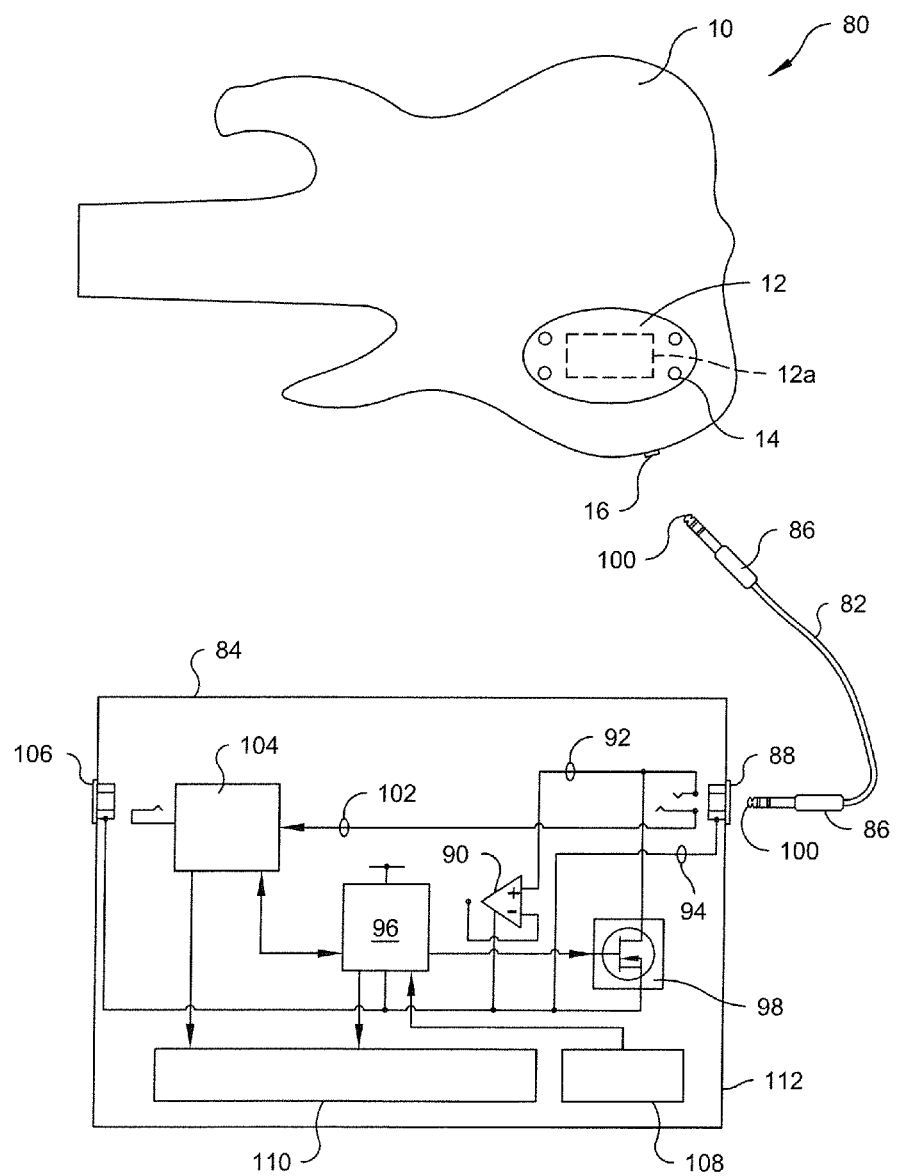

BATTERY TESTER

CROSS-REFERENCE TO RELATED APPLICATION

This application is a division of application Ser. No. 12/125,575, filed May 22, 2008, now U.S. Pat. No. 8,193,771 granted Jun. 5, 2012. The entire disclosure of application Ser. No. 12/125,575 is here incorporated by reference.

BACKGROUND OF THE INVENTION

The present invention relates to a battery tester for determining the charge level of batteries, and more specifically, the present invention relates to testing the remaining charge level of batteries that are operatively mounted within closed battery compartments of musical instrument bodies and like apparatus without having to remove or disassemble access panels and the like and without having to physically remove the batteries from the battery compartments.

As an example, electric guitars, bass guitars and other electric musical instruments typically have on-board tone control circuits that are battery powered, for instance, by one or two nine volt disposable or rechargeable batteries. The batteries are typically mounted within a battery compartment concealed within the instrument body and are accessible only by removing an access panel or the like fastened to the body with screws or like mechanical fasteners. Accordingly, if new batteries are needed or the existing batteries are to be tested, the access panel must be removed to expose and gain access to the old batteries and/or to replace the batteries.

Most electric guitars, bass guitars and other electric instruments do not have built in battery charge measurement systems. With respect to such musical instruments, this creates a problem in that, if a performer begins to play an instrument and the remaining battery charge is weak, the sound quality of the instrument will degrade rapidly with little or no advance notice. Thus, existing batteries should be replaced with new batteries or removed, tested, and reinserted before any performance.

Merely for purpose of example, battery testing devices and other portable testing devices are disclosed in general, for instance, by U.S. Pat. No. 3,974,441 issued to Van Den Haak; U.S. Pat. No. 5,003,250 issued to Hukuba; U.S. Pat. No. 5,376,887 issued to Saubolle; U.S. Pat. No. 5,216,371 issued to Nagai; U.S. Pat. No. 4,020,243 issued to Oldford; U.S. Pat. No. 6,121,753 issued to Walker et al.; U.S. Pat. No. 3,493,863 issued to Girdwood; U.S. Pat. No. 4,514,695 issued to Lau; U.S. Pat. No. 4,360,780 issued to Skutch, Jr.; U.S. Pat. No. 4,439,736 issued to Schwartz; D330,519 issued to Wang; U.S. Pat. No. 1,337,160 issued to Riebeth; U.S. Pat. No. 4,743,831 issued to Young; U.S. Pat. No. 6,347,958 B1 issued to Tsai; and U.S. Pat. No. 4,533,864 issued to Austin. In particular, the '441 patent to Van Den Haak discloses a device for checking the energy level of a battery in a powered model airplane, boat or car. This battery checking device includes a plug that is removably connectible to a battery recharging receptacle on the model airplane, boat or car and does not require the battery to be removed from the model to perform a check of the battery.

While the battery testing and other devices disclosed by the above referenced patents may function in an acceptable manner, there is a need for a convenient and simple manner of testing battery charge level remaining in batteries installed within various electronic devices, such as musical instruments. Preferably, the battery check should be obtained without the need for fastener removing tools, such as screw drivers or the like, without the need to remove or disassemble access panels or the like, and without the need to gain direct access to, and/or remove, the batteries that are to be checked.

SUMMARY OF THE INVENTION

The present invention is directed to a battery tester that can be used to determine a remaining level of charge of a battery mounted within a separate electronic device having an audio jack. The battery tester includes a plug and a circuit having a high impedance input amplifier. At least one electrical contact of the plug is electrically coupled to an input of the high impedance input amplifier. The plug is removably insertable within the audio jack such that the battery of the separate electronic device is electrically connected to the input of the high impedance input amplifier. When electrically coupled to the battery, an output of the high impedance input amplifier provides a signal proportional to the remaining level of charge of the battery, whereby the remaining level of charge of the battery is obtainable by the battery tester without having to remove the battery from the electronic device.

BRIEF DESCRIPTION OF THE DRAWINGS

The foregoing and other features and advantages of the present invention should become apparent from the following description when taken in conjunction with the accompanying drawings, in which.

FIG. 5 is a schematic view of an assembly of a guitar and a separate electronic apparatus, such as a tuner, that incorporates the battery testing circuit according to the present invention within the apparatus.

DETAILED DESCRIPTION

Figure 1:
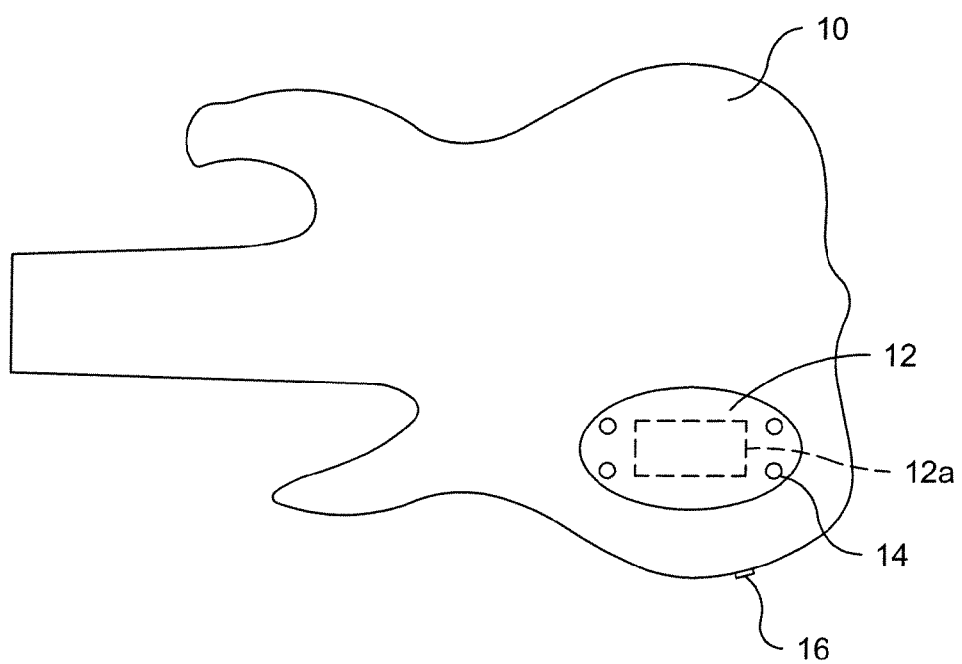
FIG. 1 is a rear plan view of a electric guitar body of the prior art.

An example of a conventional electric guitar body 10 having an access panel 12 secured to a rear of the body 10 with fasteners 14, such as screws, is shown in FIG. 1. A battery compartment 12a is located behind the access panel 12 in close proximity to an audio jack, or receptacle, 16. The batteries in the compartment 12a power the on-board electronic tone controls of the electric guitar.

Figure 2:
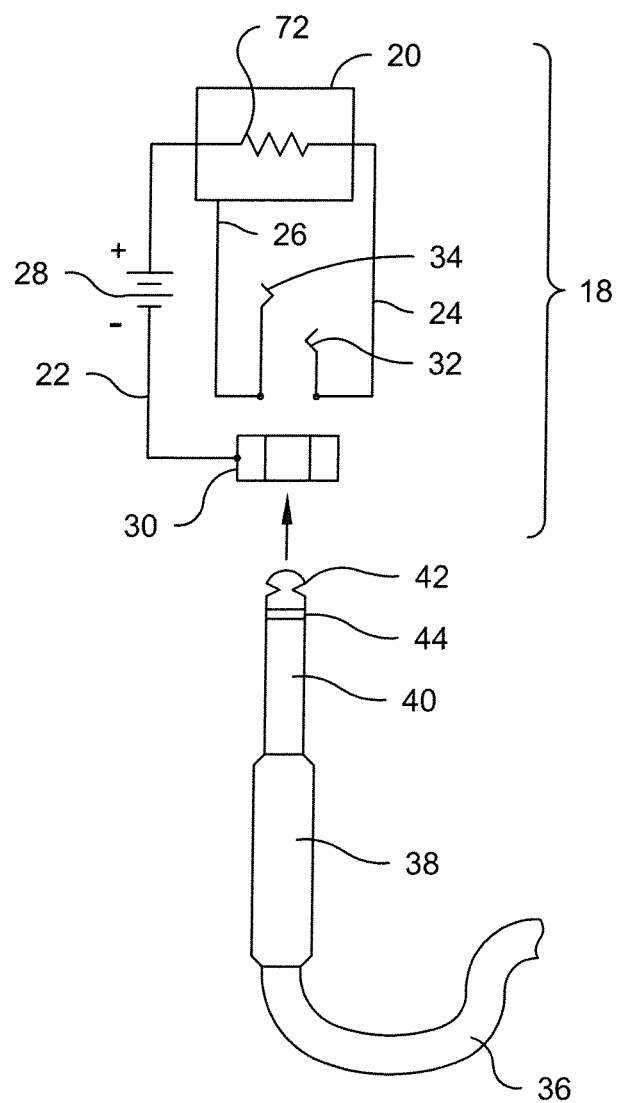
FIG. 2 is a schematic view of the wiring of on-board electronic tone controls of a prior art instrument, such as a guitar, and a prior art cable having an audio plug interconnecting the electric guitar to an amplifier or like apparatus.

The wiring of typical on-board electronic tone controls 18 is shown in the upper half of FIG. 2. The on-board electronic tone control 18 includes a tone control circuit 20 and wiring branches 22, 24 and 26 electrically interconnected thereto. Battery wiring branch 22 interconnects one or more batteries 28 to a first power contact 30 of the audio jack 16, and power wiring branch 24 interconnects the tone control circuit 20 to a second power contact 32 of the audio jack 16. Wiring branch 26 transfers the electronic audio signals produced by the guitar to an audio contact 34 of the audio jack 16.

The lower half of FIG. 2 illustrates an end section of a standard audio cable 36 that connects the output of the guitar to an amplifier or other apparatus (not shown). The cable 36 includes a standard audio plug 38 receivable within audio jack 16 of the guitar. The standard audio plug 38 includes an elongate, cylindrical contact 40 and an exposed audio plug tip 42. These sections of the plugs are electrically isolated from each other, for instance, by insulator 44. The tip 42 is connected to internal wiring (not shown) of the cable 36 that transmits the audio signal to the amplifier or like apparatus.

Accordingly, when audio plug 38 is inserted into audio jack 16, the elongate, cylindrical contact 40 electrically connects the first and second power contacts, 30 and 32, of the audio jack 16. This completes the power circuit and energizes the tone control circuit 20. In addition, the audio plug tip 42 engages the audio contact 34 of the audio jack 16 thereby enabling an audio signal to be transmitted from the tone control circuit 20 to an amplifier or like apparatus connected to the opposite end of the cable 36.

The battery tester of the present invention takes advantage of the above referenced tone control circuit and wiring to enable the batteries 28 to be tested without having to remove the batteries 28 from the battery compartment 12a and without having to remove the access panel 12 or fasteners 14 from the guitar body 10. The battery tester of the present invention uses the audio jack 16 to gain electrical access to the batteries 28 for purposes of determining the remaining charge level of the batteries 28. Thus, according to the present invention, the battery tester is simply plugged into the audio jack 16 of the guitar or like instrument to obtain the desired charge level information.

Figure 4:
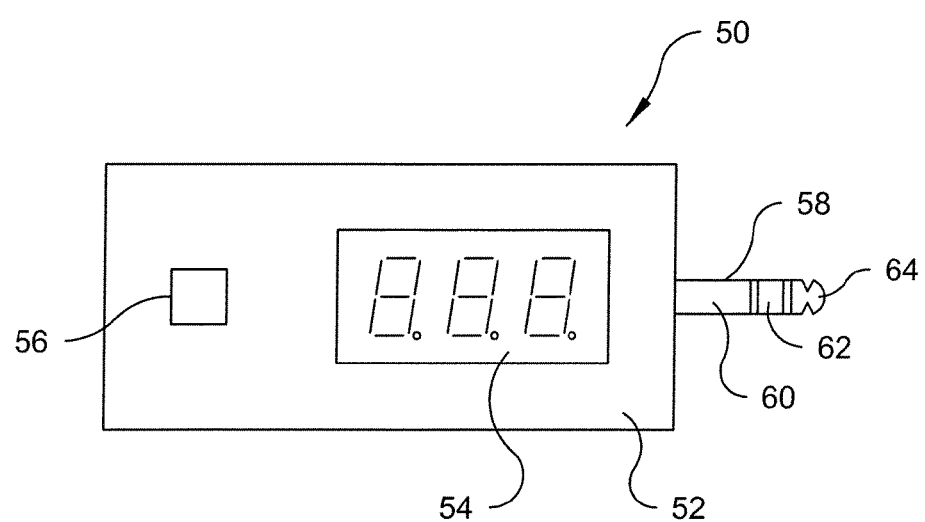
FIG. 4 is a plan view of a first embodiment of a handheld portable battery tester according to the present invention.

An example of a portable, handheld version of the battery tester 50 according to the present invention is shown in FIG. 4. This version of the battery tester includes a housing 52, a display 54, a power switch 56, and a battery measurement plug 58 which is receivable within audio jack 16 of the guitar.

Figure 3:
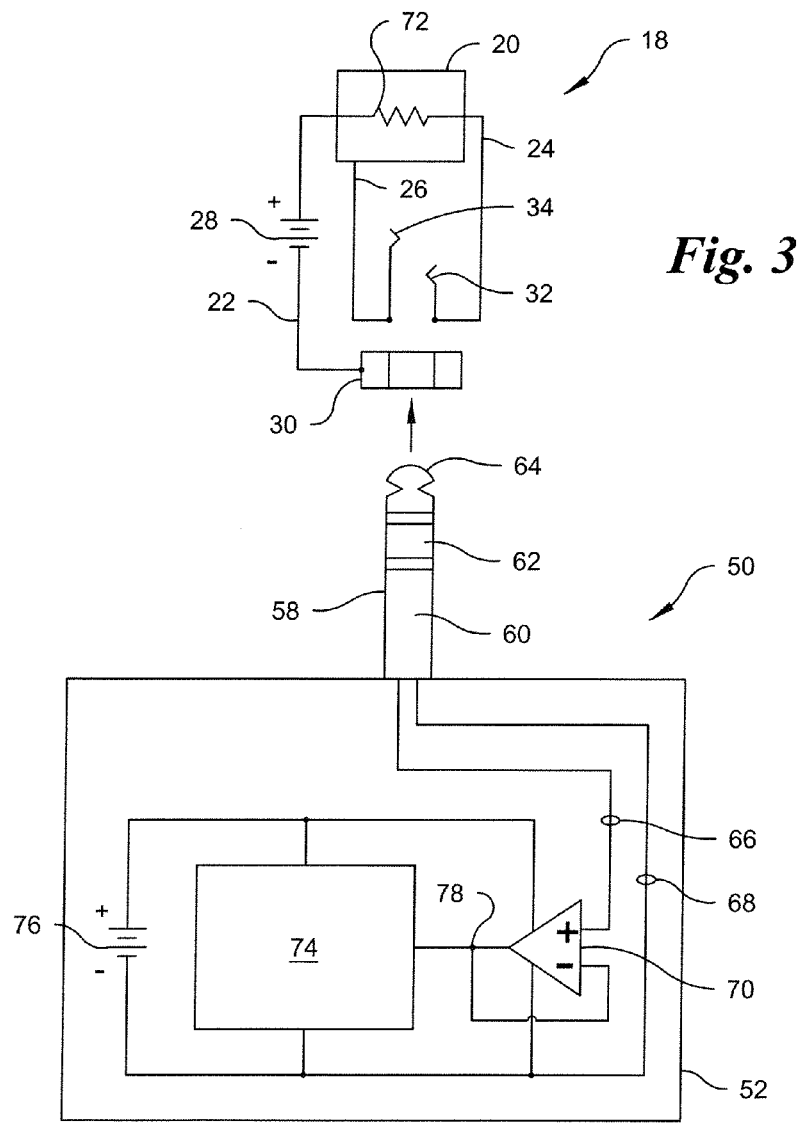
FIG. 3 is a schematic view of battery tester according to the present invention for use with on-board electronic tone controls of the instrument of FIG. 2.

The operation of the battery tester 50 is best illustrated schematically in FIG. 3. The upper half of FIG. 3 shows the wiring of typical on-board electronic controls 18 discussed above, and the lower half of FIG. 3 shows the circuitry of the battery tester 50 of the present invention.

The battery measurement plug 58 can be a standard stereo plug. Accordingly, the plug 58 includes three separate contacts including a cylindrical base contact 60, a cylindrical intermediate contact 62, and a tip contact 64. When plug 58 is inserted into audio jack 16, the battery wiring branch 22 of the tone control circuit 20 is electrically connected to base contact 60 of the plug 58 and wiring 68 within the tester 50, and the power wiring branch 32 of the tone control circuit 20 is electrically connected to intermediate contact 62 of the plug 58 and wiring 66 within the tester 50.

The tester 50 includes a high impedance input amplifier 70 that is powered by a power source 76 located in the housing 52 of the tester 50. A high impedance input type of amplifier is required to measure battery charge level due to the effective circuit impedance 72 of the tone control circuit 20. The high impedance input amplifier 70 is electrically connected to the wiring 66 and 68, and this arrangement is best illustrated in FIG. 3 and shows how the batteries 28 and the tone control circuit 20 within the guitar are electrically coupled to the high impedance input amplifier 70. For instance, the wiring 66 interconnects the effective circuit impedance 72 and the battery 28 to a non-inverting (+) input of the amplifier 70 while wiring 68 connects to the negative side of the power source 76. In addition, the output 78 of the high impedance input amplifier is electrically connected to the inverting (−) input of the amplifier 70 providing a voltage follower arrangement.

The signal produced on the output 78 of the high impedance input amplifier 70 is proportional to battery charge level of batteries 28 and is provided to a microprocessor, A/D converter, digital display, and/or bar graph indicator circuit 74 or the like. See FIG. 3. According to one contemplated embodiment, the indicator circuit 74 includes a microprocessor that calculates battery charge level based on steady state level, initial peak when the tester 50 is plugged into the audio jack 16, and/or decay of battery level signal.

The display 54 of the tester 50 can be an LED or LCD and can show battery level in volts, percentage, etc. and/or can show this information in a numerical form or in the form of a bar graph. Alternatively, the tester can produce audible or other signals to indicate remaining battery charge level. Upon measurement of the battery voltage, the device can also provide an indication that the battery charge is low and should be replaced or that the battery charge is acceptable. A battery low message or alarm or a battery okay message can be displayed on the tester 50. The tester 50 may be automatically powered when plugged into an audio jack 16 or can include a power switch 56. Switch 56 may also be provided for selecting a mode of display of the tester 50, such as volts, percentage, or status.

As an alternative to a portable, handheld version of the battery tester of the present invention, the battery tester can also be included as part of another apparatus, such as a tuner or the like. As an example, see the assembly 80 shown in FIG. 5. The assembly 80 includes the guitar body 10, a cable 82, and electronic apparatus 84. The guitar body 10 is identical to that discussed above with respect to FIGS. 1 and 2. The cable 82 includes a pair of plugs 86 that are the same as the battery measurement, or stereo, plugs 58 discussed above with respect to FIGS. 3 and 4. The apparatus 84 can be any guitar-related piece of electronic equipment and includes the battery testing circuitry discussed above with respect to FIG. 3.

The apparatus 84 can include a first receptacle, or jack, 88 for receiving one of the plugs 86 of cable 82. The opposite plug 86 of cable 82 can be plugged into the audio jack 16 of the guitar body 10. Accordingly, for the same reasons discussed above, the battery charge level of batteries 28 of the tone control circuit 20 on-board the guitar is available for measurement by a high impedance input amplifier 90 of apparatus 84 via wiring 92 and 94 extending from the first jack 88. See FIG. 5. As discussed previously, the high impedance input amplifier 90 is required to measure the battery level signal due to the effective circuit impedance 72 of the tone control circuit 20 of the guitar. The signal output by high impedance input amplifier 90 is a signal proportional to the battery charge level, and this is applied to a system microcontroller 96 having an A/D converter. As an example, the microcontroller 96 may include algorithms to calculate remaining battery charge level based on steady state charge level and initial peak and decay of battery charge level signal.

After the battery charge level measurement is complete, the internal circuitry of the guitar can be powered by the actions of a switching mechanism 98, which can be a MOSFET as illustrated, or mechanical contacts, bipolar transistor, or some other device. After the internal circuitry of the guitar is energized, the normal audio signal produced by the guitar is transmitted via tip contacts 100 of the plugs 86 of the cable 82 and by wiring 102 of apparatus 84 to the signal processor or tuner 104 of the apparatus 84. The output of the signal processor or tuner 104 is available at output receptacle or jack 106 via use of a standard audio cable with a standard audio jack.

An advantage of embodying the battery tester of the present invention as a circuit integrated into another piece of equipment, such as a tuner or effects processor, is that the microcontroller 96, user input control keys 108, and display 110 may all be shared as well as the housing 112 and power supply (not shown). Thus, the additional feature of battery testing can be provided at a minimum of cost.

While preferred battery testers have been described in detail, various modifications, alterations, and changes may be made without departing from the spirit and scope of the present invention as defined in the appended claims.

The invention claimed is:

1. A battery tester for determining a remaining level of charge of a battery mounted within a separate electronic device having an audio jack, comprising a circuit including a high impedance input amplifier and a plug having a contact that is electrically coupled to an input of said high impedance input amplifier, said plug being removably insertable within the audio jack such that said contact of said plug electrically connects the battery to said input of said high impedance input amplifier, said high impedance input amplifier having an output that produces a signal proportional to the remaining level of charge of the battery, whereby the remaining level of charge of the battery is obtainable by said battery tester without having to remove the battery from the electronic device.

2. A battery tester according to claim 1, further comprising an indicator electrically connected to said output of said high impedance input amplifier, said indicator producing an audible or visible indication of the remaining level of charge of the battery based on the output signal of said high impedance input amplifier.

3. A battery tester according to claim 2, wherein said indicator includes at least one of a microprocessor, A/D converter, digital display, and bar graph indicator.

4. A battery tester according to claim 2, further comprising a power source that powers said indicator and said high impedance input amplifier, a housing within which said high impedance input amplifier and power source are contained, and in which said indicator comprises a visual display on said housing for providing said visible indication of the remaining level of charge in the battery.

5. A battery tester according to claim 2, wherein said indicator includes a microprocessor that calculates the remaining level of charge of the battery based on at least one of steady state charge, initial peak, and decay of charge.

6. A battery tester according to claim 2, including a housing within which said high impedance input amplifier and power source are contained, wherein said plug extends rigidly from said housing and includes at least two electrically isolated contacts.

7. A battery tester according to claim 2, including a housing within which said high impedance input amplifier and power source are contained, wherein said plug is a stereo plug including a base cylindrical contact, an intermediate cylindrical contact, and a tip contact that are insulated from one another.

8. A method of determining the remaining level of charge of at least one battery contained within a battery compartment of an electric musical instrument, comprising the steps of: inserting a plug of a battery tester into an audio jack of the instrument to electrically couple the at least one battery to the battery tester without removing said at least one battery from within the instrument; and observing an indication of the remaining level of charge produced by the battery tester in response to said inserting step.

9. A method according to claim 8, wherein said inserting step includes electrically coupling the effective circuit impedance of an on-board tone control circuit of the instrument and the at least one battery in series to an input of an amplifier in the battery tester.

10. A method according to claim 8, wherein the observed indication is produced by an indicator circuit of the battery tester that is electrically coupled to an output of said input amplifier, the output being proportional to the remaining level of charge of the at least one battery.

* * * * *